United States Patent
Lin (10) Patent No.: US 12,298,662 B2
(45) Date of Patent: *May 13, 2025

(54) MASK FOR EUV LITHOGRAPHY AND METHOD OF MANUFACTURING THE SAME

(71) Applicant: TAIWAN SEMICONDUCTOR MANUFACTURING COMPANY, LTD., Hsinchu (TW)

(72) Inventor: Yun-Yue Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 135 days.

This patent is subject to a terminal disclaimer.

(21) Appl. No.: 17/853,726

(22) Filed: Jun. 29, 2022

(65) Prior Publication Data

US 2022/0334463 A1    Oct. 20, 2022

Related U.S. Application Data

(60) Division of application No. 17/074,509, filed on Oct. 19, 2020, now Pat. No. 11,402,745, which is a continuation of application No. 16/141,719, filed on Sep. 25, 2018, now Pat. No. 10,809,613.

(51) Int. Cl.
| | |
|---|---|
| *G03F 1/48* | (2012.01) |
| *G03F 1/22* | (2012.01) |
| *G03F 1/54* | (2012.01) |
| *G03F 1/76* | (2012.01) |
| *G03F 7/038* | (2006.01) |
| *G03F 7/039* | (2006.01) |

(52) U.S. Cl.
CPC .............. *G03F 1/48* (2013.01); *G03F 1/22* (2013.01); *G03F 1/54* (2013.01); *G03F 1/76* (2013.01); *G03F 7/038* (2013.01); *G03F 7/039* (2013.01)

(58) Field of Classification Search
CPC ..... G03F 1/48; G03F 1/22; G03F 1/76; G03F 1/54; G03F 1/24; G03F 1/38
See application file for complete search history.

(56) References Cited

U.S. PATENT DOCUMENTS

| | | |
|---|---|---|
| 8,796,666 B1 | 8/2014 | Huang et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |

(Continued)

OTHER PUBLICATIONS

Notice of Allowance issued in U.S. Appl. No. 16/141,719, dated Jun. 17, 2020.

(Continued)

*Primary Examiner* — Stewart A Fraser
(74) *Attorney, Agent, or Firm* — STUDEBAKER BRACKETT PLLC (57) ABSTRACT

A mask for extreme ultraviolet (EUV) lithography includes a multilayer (ML) stack including alternating metal and semiconductor layers disposed over a first surface of a mask substrate, a capping layer disposed over the ML stack, and an absorber layer disposed over the capping layer. An image pattern is formed in the absorber layer. A border layer surrounding the image pattern is disposed over the absorber layer.

20 Claims, 11 Drawing Sheets

(56) References Cited

U.S. PATENT DOCUMENTS

| | | | |
|---|---|---|---|
| 9,548,303 B2 | 1/2017 | Lee et al. | |
| 9,618,837 B2 | 4/2017 | Lu et al. | |
| 9,869,928 B2 | 1/2018 | Huang et al. | |
| 9,869,934 B2 | 1/2018 | Huang et al. | |
| 9,869,939 B2 | 1/2018 | Yu et al. | |
| 11,402,745 B2* | 8/2022 | Lin | G03F 1/48 |
| 2007/0128528 A1 | 6/2007 | Hess et al. | |
| 2013/0029253 A1 | 1/2013 | Mangat et al. | |
| 2013/0196256 A1* | 8/2013 | Ryu | G03F 1/24 |
| | | | 430/5 |
| 2016/0154296 A1 | 6/2016 | Kim et al. | |
| 2017/0068157 A1 | 3/2017 | Park et al. | |
| 2019/0101817 A1 | 4/2019 | Lin | |
| 2019/0196322 A1 | 6/2019 | Lin et al. | |

OTHER PUBLICATIONS

Notice of Allowance issued in U.S. Appl. No. 17/074,509, dated Mar. 31, 2022.

\* cited by examiner

MASK FOR EUV LITHOGRAPHY AND METHOD OF MANUFACTURING THE SAME

RELATED APPLICATIONS

This application is a divisional of U.S. patent application Ser. No. 17/074,509 filed Oct. 19, 2020, which is a continuation of U.S. application Ser. No. 16/141,719 filed Sep. 25, 2018, now U.S. Pat. No. 10,809,613, the entire content of each of which is incorporated herein by reference.

TECHNICAL FIELD

The present disclosure relates generally to a photo mask (reticle) for extreme ultra violet (EUV) lithography, and a method for manufacturing the same.

BACKGROUND

EUV lithography is the most promising technology for semiconductor device manufacturing of the 10 nm node and beyond. In EUV lithography, an EUV photo mask is one of the key elements. For an EUV photo mask, multiple mask parameters should be optimized to achieve precise and high resolution pattern forming in EUV lithography. Such parameters include, but are not limited to, an absorber height, optimum optical proximity effect corrections (OPC) needed for shadowing correction, an increase of reflectivity in image fields and optimum image borders.

EUV photo masks have a black border area, over which mask blades of an EUV lithography tool are placed. The black border is a pattern free dark area around the die on the photomask serving as transition area between parts of the mask that are shielded from the exposure light by the reticle masking (REMA) blades and the die. When printing a die at dense spacing on an EUV scanner, the EUV light reflection from the image border overlaps edges of neighboring dies. This reflected light also contains various wavelengths that are not required, known as out-of-band (OOB) light. The OOB light adversely affects the accuracy of patterns to be formed on a substrate, in particular sections around the periphery of the pattern on the substrates. Additionally, leakage of EUV radiation occurs during exposure of adjacent dies because of residual absorber reflectivity and REMA blade instability, resulting in over exposure around die edges. To reduce this effect, a black border area is placed between adjacent dies. The black border area can solve CD non-uniformity caused by neighboring die exposure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In EUV photolithography, the EUV light rays emitted from a plasma are reflected off a collector mirror, directed toward a patterned EUV mask, and reflected off the EUV mask onto the target substrate. An EUV reflective mask includes a substrate, an EUV reflective multilayered (ML) structure, and an EUV absorbing layer ('absorber'). The EUV absorbing layer is patterned by etching portions of the absorbing layer to expose the underlying ML structure in those portions to form a desired pattern. EUV radiation is reflected from the exposed ML structure on to a target substrate coated with a EUV resist. The portions of EUV absorbing layers left unetched absorb the EUV radiation so as not to reflect EUV radiation on to the target substrate, thereby forming the desired pattern on the target substrate.

In various embodiments, a layer of photosensitive material (sensitive to either EUV) is provided on the target substrate and exposed to an EUV beam reflected from the EUV mask. In some embodiments, the target substrate is an unpatterned wafer, and in other embodiments, the target substrate has one or more patterned layers with patterns previously printed using lithography, deposition and/or etching processes. In embodiments where the EUV mask includes, for example, test structures used for calibration of a wafer pattern, an unpatterned substrate is used to avoid complexities resulting from uneven surface of a patterned substrate. In some embodiments, the unpatterned substrate includes a silicon wafer with a layer of silicon dioxide or silicon nitride on top. The thickness of the silicon dioxide or silicon nitride is not particularly limited. In such embodiments, the photosensitive layer, e.g., of a photoresist material, is disposed on the silicon dioxide or silicon nitride layer, e.g., by spin coating, exposed to EUV radiation beam reflected from the EUV mask, and developed to form a patterned photoresist layer on the wafer. The pattern is then printed on the wafer by etching the silicon oxide or silicon nitride layer using the patterned photoresist layer as an etch mask. The photoresist layer is then removed in some embodiments. However, in some embodiments, for example, where measuring the characteristics of the photoresist itself is of interest the photoresist layer is not removed. In such embodiments, processing steps can be reduced by leaving the silicon dioxide or silicon nitride layer unetched.

The thickness of the EUV absorbing layer, the thickness of each of the layers in the ML structure, surface roughness of the above layers, and the homogeneity of the material properties throughout the layers determine the quality of EUV radiation irradiating the target substrate. In industrial practice, off-axis illumination or other factors can cause a shadow effect on the target substrate and variations in the thickness of the EUV absorbing layer can affect the proper functioning of the combination of the EUV absorbing layer and the ML structure.

Figure 1:
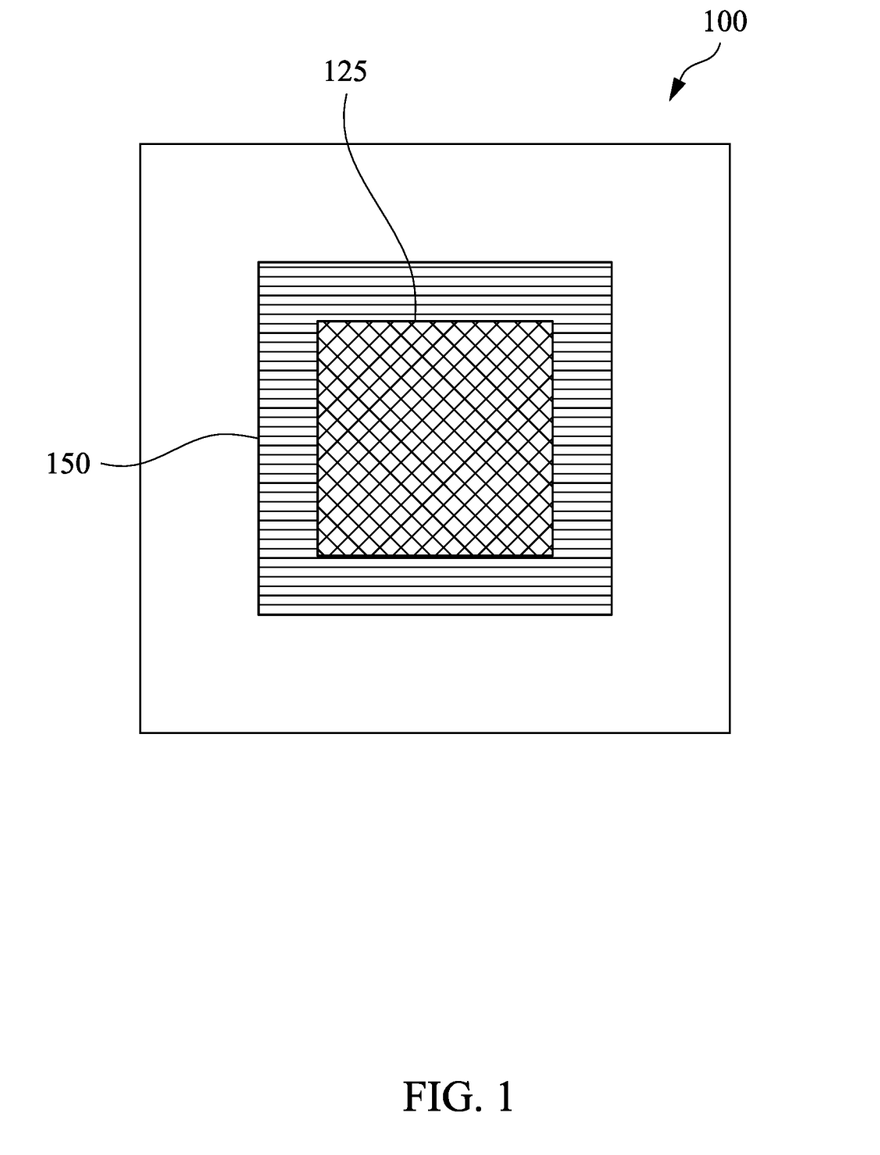
FIG. 1 schematically shows a black border formed around an image field in a EUV mask.

FIG. 1 schematically shows a black border formed around an image field in a EUV mask. The 'black border' 150 is formed at the edge of the desired patterns (i.e., image field 125) of the EUV reflective mask 100 to avoid over-exposure of the edge of the patterns in an adjacent die. The 'black border' is a non-reflective area formed to prevent exposure of adjacent dies because of residual absorber reflectivity, off-axis reflection shadow effects, OOB light, etc.

Figure 2:
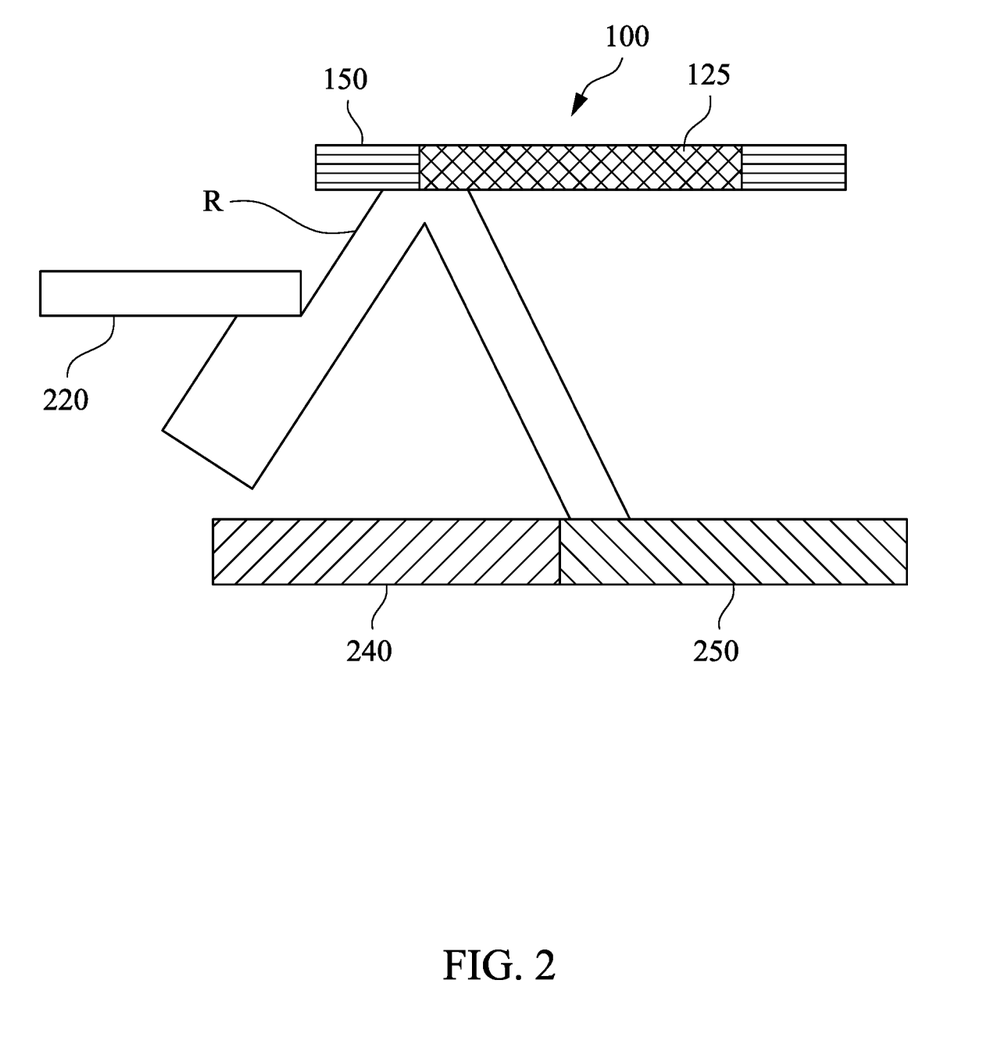
FIG. 2 schematically shows the effect of a black border region in reducing undesired exposure of adjacent dies.

FIG. 2 schematically shows how the black border reduces undesired exposure of adjacent dies. Radiation R incident on the black border 150 (despite the presence of ReMa blades 220) is absorbed by the black border 150, preventing exposure of the edge region of the adjacent die 240 adjacent to the current die 250.

In some implementations, the black border 150 is formed by etching a predetermined area around the circuit pattern to form a non-reflective trench of sufficient depth for destructive interference of any reflected EUV radiation from that region. However, the additional etching step also requires additional photolithography steps which increases the processing time and consequently increases the probability of damage to the circuit pattern on the mask. Moreover, the additional etching step may result in particulate residue diffusing on to the circuit pattern causing undesired defects. Such implementations of the black border are, therefore, susceptible to longer processing times and lower yield.

To alleviate some of these disadvantages, in some implementations, a predetermined region around the circuit pattern is laser annealed from back-side of the mask (i.e., substrate side rather than the pattern side) to intentionally change the ML structure and thereby, change the reflectivity of the ML structure at the desired wavelength. However, because the change in the reflectivity of the ML structure in such a process comes about due to physical and chemical changes induced by heat, it is difficult to precisely control the area in which such changes occur, thereby potentially damaging the image region. Alternate forms and methods of forming black border for EUV mask are, therefore, desired.

The present disclosure generally relates to EUV masks, and in particular to a non-reflective "black border" for EUV masks, and a method for making EUV masks with the non-reflective black border. The EUV mask and methods of making the EUV masks provide for formation of a black border region without substantial additional lithographic processing or heating steps, thereby avoiding the problems of potentially damaging the image region.

Figure 3:
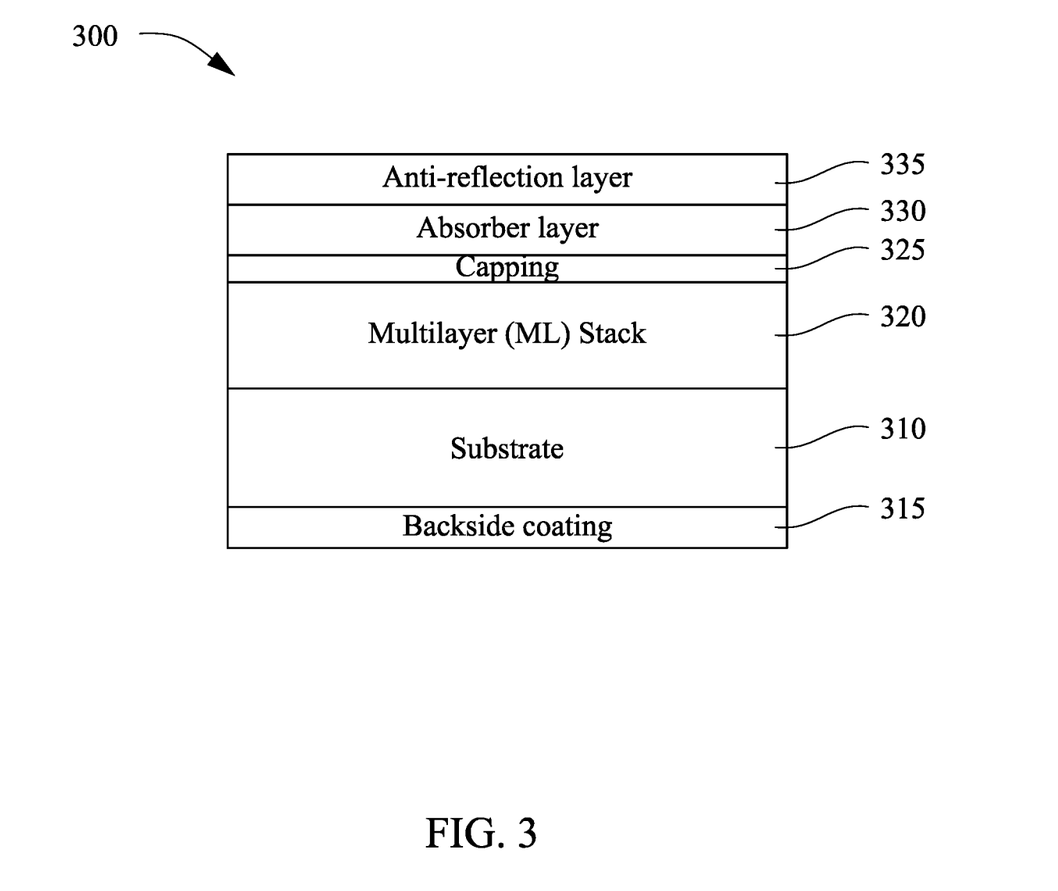
FIG. 3 schematically illustrates a cross-section of an EUV mask blank used for making an EUV mask in accordance with an embodiment of the present disclosure.

FIG. 3 schematically illustrates a cross-section of an EUV mask blank used for making an EUV mask in accordance with an embodiment of the present disclosure. In an embodiment, an EUV mask blank 300 includes a multilayered EUV reflective (ML) stack 320 disposed over a first major surface of a mask substrate 310. A capping layer 325 is disposed on the ML stack 320, and an EUV absorbing layer or absorber 330 is disposed over the capping layer 325.

In some embodiments, as depicted in FIG. 3, an antireflection layer 335 is disposed over the absorber layer 330, and a conductive backside coating layer 315 is dispose on the second major surface of the mask substrate 310 opposite the first major surface on which the ML stack 320 is disposed. The conductive backside coating layer 315 is used to fix the mask for photolithographic operation by electrostatic chucking in some embodiments. In an embodiment, the conductive layer 315 is formed of a ceramic compound including CrN, CrO, TaB, TaBN, TaBO, TaO, TaN, Ta or any suitable material for electrostatic chucking of the mask.

The mask substrate 310 is made of a low thermal expansion glass material including titanium oxide doped silicon dioxide, or any other suitable low thermal expansion materials such as quartz, silicon, silicon carbide, and/or other low thermal expansion substances known in the art that can minimize the image distortion due to mask heating in the EUV photolithographic environment, in some embodiments. In some embodiments, the mask substrate 310 has a low defect level, such as a high purity single crystal substrate, and a low level of surface roughness, as measured using an atomic force microscope.

The ML stack 320 includes alternating Mo layers and Si layers deposited over the mask substrate 310. The ML stack 320 provides Fresnel resonant reflections across the interfaces between the Mo layer and Si layer of different refractive indices by use of an appropriate thickness for each layer inside the ML structure. High quality reflections rely on constructive interference by phase-matching and intensity adding-up of light rays reflected from different layers. The thickness of the layers depends on the wavelength of the incident light and the angle of incidence to the EUV mask blank 300. For a specific angle of incidence, the thickness of each of the layers of the ML stack 320 is chosen to achieve maximal constructive interference for light reflected at different interfaces of the ML stack 320. Thus, even thickness and low surface roughness of each of the layers in the ML stack 320 are required for high quality Fresnel resonant reflections. A thickness of each of the layers in the ML stack 320 is about 3 nm to about 7 nm in some embodiments.

In some embodiments of the present disclosure, the ML stack 320 includes alternating molybdenum layers and beryllium layers. In some embodiments, the number of layers in the ML stack 320 is in a range from about 20 to about 100 although any number of layers is allowed as long as sufficient reflectivity is maintained for imaging the target substrate. In some embodiments, the reflectivity is higher than about 70% for wavelengths of interest e.g., 13.5 nm. In some embodiments, the ML stack 320 includes about 30 to about 60 alternating layers of Mo and Si (or Be). In other embodiments of the present disclosure, the ML stack 320 includes about 40 to about 50 alternating layers each of Mo and Si (or Be).

Methods of forming the layers of the ML stack 320 include, but are not limited to, physical vapor deposition (PVD) processes such as evaporation, RF or DC sputtering; chemical vapor deposition (CVD) processes, such as atmospheric-pressure, low-pressure, plasma-enhanced, and high-density plasma CVD; atomic layer deposition (ALD); ion beam deposition; and liquid-phase non-vacuum methods such as a sol-gel method and metal-organic decomposition; and/or any other suitable method known in the art.

The capping layer 325 formed over the ML stack 320 prevents oxidation of the ML stack 320 in some embodiments. In some embodiments, the capping layer 325 is formed of a material such as, for example, silicon and ruthenium. In some embodiments, the capping layer 325 has a thickness in a range from about 2 nm to about 7 nm. Methods of forming the capping layer 325 include, without limitation, ion beam deposition, (IBD), physical vapor deposition (PVD) processes such as evaporation, RF or DC sputtering; chemical vapor deposition (CVD) processes, such as atmospheric-pressure, low-pressure, plasma-enhanced, and high-density plasma CVD; atomic layer deposition (ALD); ion beam deposition; and liquid-phase non-vacuum methods, such as a sol-gel method and a metal-organic decomposition; and/or any other suitable method known in the art.

The EUV absorbing layer or absorber 330 formed over the capping layer 325 absorbs radiation having a wavelength in a range of EUV wavelengths, e.g., at 13.5 nm. The EUV absorbing layer 330 is formed of a single layer or multiple layers in some embodiments of the present disclosure. In some embodiments, the EUV absorbing layer 330 is formed of a material including a tantalum compound. In some embodiments, the EUV absorbing layer 330 is formed of TaN or TaBN. In some embodiments, the material used to make the EUV absorbing layer 330 also includes molybdenum, palladium, zirconium, nickel, nickel oxide, nickel silicide, titanium, titanium nitride, chromium, chromium oxide, aluminum oxide, aluminum-copper alloy, or other suitable materials.

Methods of forming the EUV absorbing layer or absorber 330 include, but are not limited to, physical vapor deposition (PVD) processes, such as evaporation, RF or DC sputtering; chemical vapor deposition (CVD) processes, such as atmospheric-pressure, low-pressure, plasma-enhanced, and high-density plasma CVD; atomic layer deposition (ALD); ion beam deposition; and liquid-phase non-vacuum methods, such as a sol-gel method and a metal-organic decomposition, and/or any other suitable method known in the art.

The anti-reflection layer 335 disposed over the EUV absorbing layer 330 is formed of a material including $SiO_2$, SiN, TaBO, TaO, CrO, ITO (indium tin oxide), or any suitable material, in some embodiments. The antireflection layer 335 reduces residual reflection from the absorber layer 330. In some embodiments, the antireflection layer 335 is formed of an EUV absorber material different from that of the absorber layer 330. In other embodiments, the antireflection layer 335 is formed to change a phase of any EUV radiation reflected from the absorber layer 330 so as to reduce the intensity of the reflected EUV radiation via destructive interference.

Methods of forming the anti-reflection layer 335 include, for example, physical vapor deposition (PVD) processes, such as evaporation, RF or DC sputtering; chemical vapor deposition (CVD) processes such as atmospheric-pressure, low-pressure, plasma-enhanced, and high-density plasma CVD; atomic layer deposition (ALD); ion beam deposition; and liquid-phase non-vacuum methods, such as a sol-gel method and a metal-organic decomposition; and/or any other suitable method known in the art.

Figure 4:
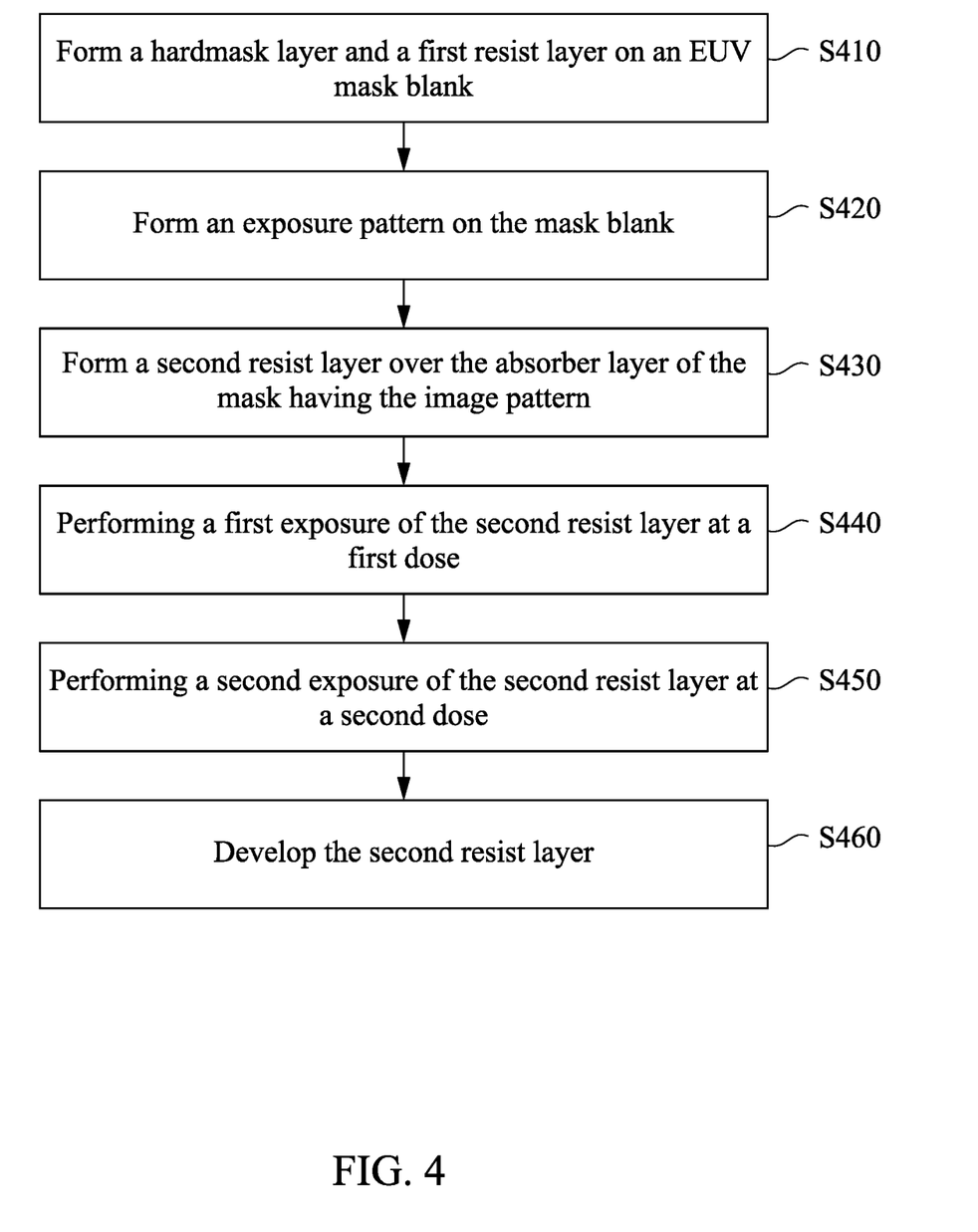
FIG. 4 shows a flow chart for a process of fabricating an EUV mask in accordance with an embodiment of the present disclosure.
Figure 5:
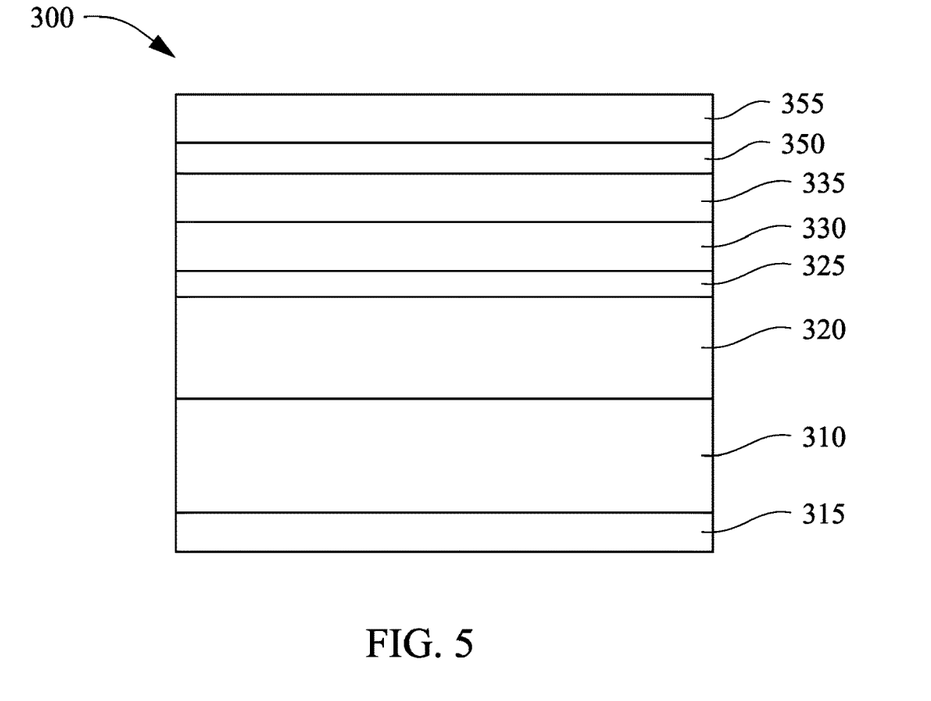
FIG. 5 schematically illustrates a cross-section of one of the various stages during a process of fabricating an EUV mask in accordance with an embodiment of the present disclosure.

An aspect of the present disclosure provides a method of fabricating an EUV mask having a black border region surrounding an image region. FIG. 4 shows a flow chart for a method of fabricating an EUV mask in accordance with an embodiment of the present disclosure. FIGS. 5-14 schematically illustrate cross-sections of various stages during a process of fabricating an EUV mask in accordance with an embodiment of the present disclosure. In an embodiment, the method of fabricating an EUV mask includes, at S410, forming a hardmask layer 350 and a first resist layer 355 on a mask blank 300. Specifically, as shown in FIG. 5, the hardmask layer 350 is formed on the antireflection layer 335, and a first resist layer 355 is formed on the hardmask layer 350.

In various embodiments, materials suitable for forming the hardmask layer 350 include, but are not limited to, silicon dioxide, silicon nitride, spin-on carbon, spin-on oxide, CrO, CrN, CrON, TaO, TaN, Ru, RuN, RuB, TaB, TaBN, TaBO and their oxynitride, etc. The material for the hardmask 350 is not limited so long as it is different from (and has etch selectivity over) that of the absorber layer 330. The hardmask layer 350, in various embodiments, has a thickness in a range from about 1 nm to about 100 nm. Methods of forming the hard mask layer 350 include, but are not limited to, physical vapor deposition (PVD) processes, such as evaporation, RF or DC sputtering; chemical vapor deposition (CVD) processes, such as atmospheric-pressure, low-pressure, plasma-enhanced, and high-density plasma CVD; atomic layer deposition (ALD); ion beam deposition; and liquid-phase non-vacuum methods, such as a sol-gel method and a metal-organic decomposition, and/or any other suitable method known in the art.

As shown in FIG. 5, the first resist layer 355 is formed over the hardmask layer 350. Examples of suitable resist materials for the first resist layer 355 include, without limitation, e-beam resists such as, for example, PMMA, or other commercially available positive tone or negative tone e-beam resists; or photoresists such as, for example, SU8 or other commercially available positive tone or negative tone photoresists. The first resist layer 355 is coated onto the hardmask layer 350 by a spin coating technique followed by baking, in some embodiments.

Figure 6:
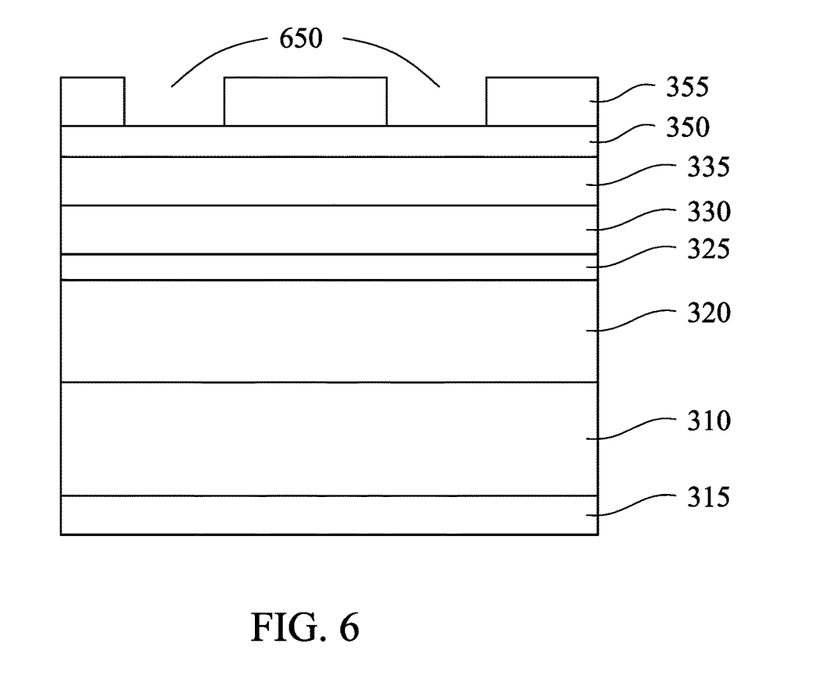
FIG. 6 schematically illustrates a cross-section of one of the various stages during a process of fabricating an EUV mask in accordance with an embodiment of the present disclosure.

At S420, the first resist layer 355 is exposed to actinic beam radiation and a developer to form an image pattern 650 in the first resist layer 355, as can be seen in FIG. 6. In some embodiments, the actinic radiation includes an electron beam, while in other embodiments, the actinic radiation includes deep ultraviolet (DUV). In embodiments where the actinic radiation includes an electron beam, the first resist layer 355 is formed of an e-beam resist such as PMMA and the image pattern 650 is formed, for example, by a direct write process where a tightly focused electron beam is scanned across the surface of the first resist layer 355 such that only the area corresponding to the image pattern is exposed to the electron beam. The e-beam resist is then developed to form the image pattern 650 in the first resist layer. On the other hand, in embodiments where the actinic radiation is DUV, a series of lithography steps (i.e., exposure through a mask followed by development) are performed to obtain the image pattern 650 in the first resist layer because the wavelength of DUV radiation is typically a lot longer than the CD of an EUV mask. The series of lithography steps, in some embodiments, include performing exposure under a liquid (i.e., immersion lithography). In some embodiments, the series of lithography steps are performed to obtain a pattern resolution that is higher than the pattern resolution obtained by a single lithography step. For example, in some embodiments, a single pattern is divided into two or more interleaving parts, each having a CD longer than that of the single pattern. The two or more parts of the single pattern are processed individually while "covering" the other parts, and all the parts of combined in the end to provide a CD that is smaller than that of each of the individual parts. For example, a 25 nm half-pitch pattern can be generated by interleaving two 50 nm half-pitch patterns, three 75 nm half-pitch patterns or four 100 nm half-pitch patterns.

Figure 7:
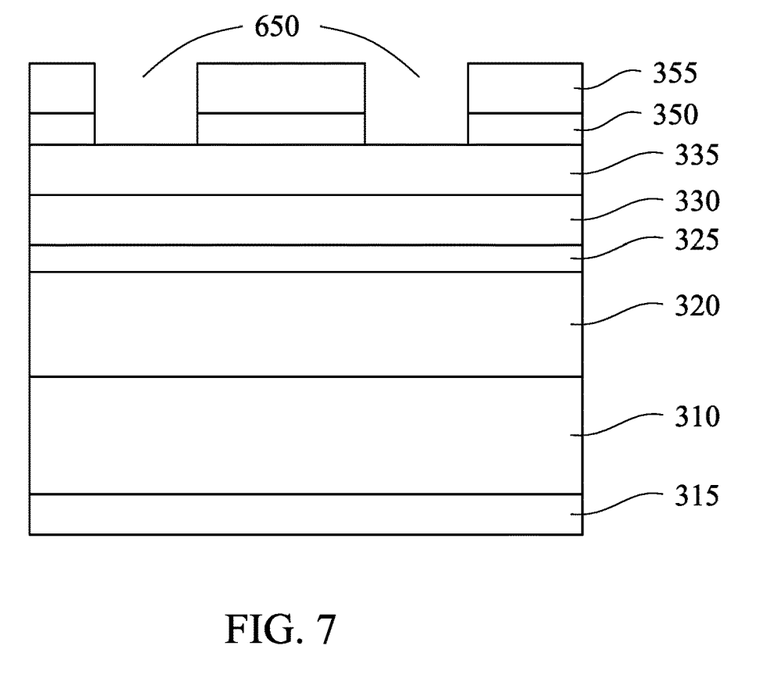
FIG. 7 schematically illustrates a cross-section of one of the various stages during a process of fabricating an EUV mask in accordance with an embodiment of the present disclosure.
Figure 8:
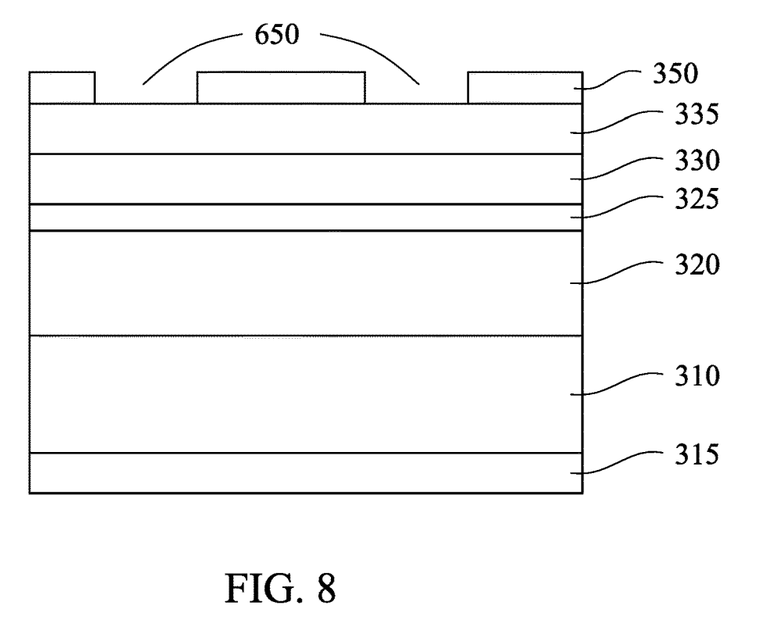
FIG. 8 schematically illustrates a cross-section of one of the various stages during a process of fabricating an EUV mask in accordance with an embodiment of the present disclosure.

The image pattern 650 formed in the first resist layer 355 is extended, as shown in FIG. 7, to the hardmask 350 by removing the portions of hardmask 350 exposed through the image pattern 350 (see FIG. 6). In some embodiments, the exposed portions of hardmask 350 are removed by performing dry and/or wet etching of the hardmask 350 using a suitable etchant. In other embodiments, the exposed portions of hardmask 350 are removed using, for example, ion milling, or other suitable techniques. As shown in FIG. 8, once the image pattern 650 is formed in the hardmask 350, the first resist layer 355 is removed in some embodiments.

Figure 9:
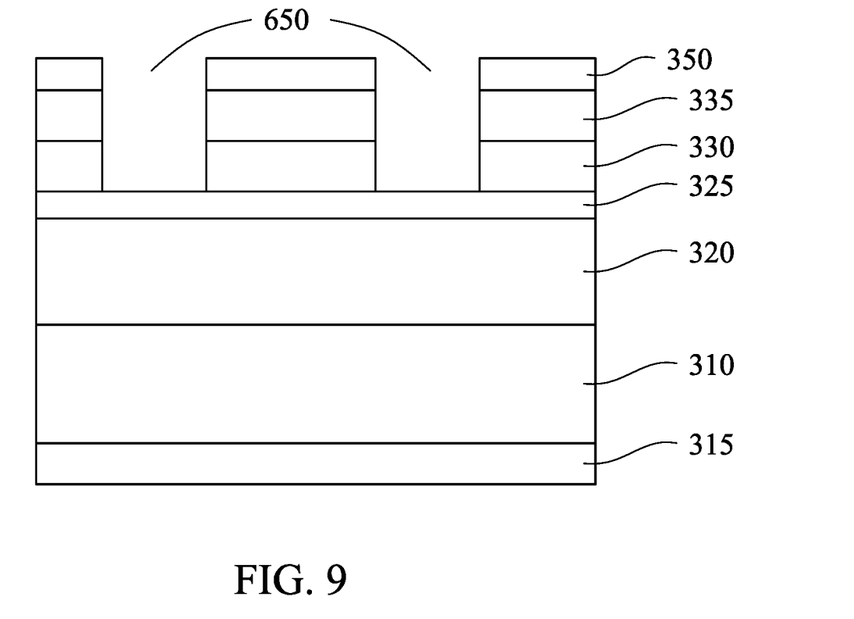
FIG. 9 schematically illustrates a cross-section of one of the various stages during a process of fabricating an EUV mask in accordance with an embodiment of the present disclosure.
Figure 10:
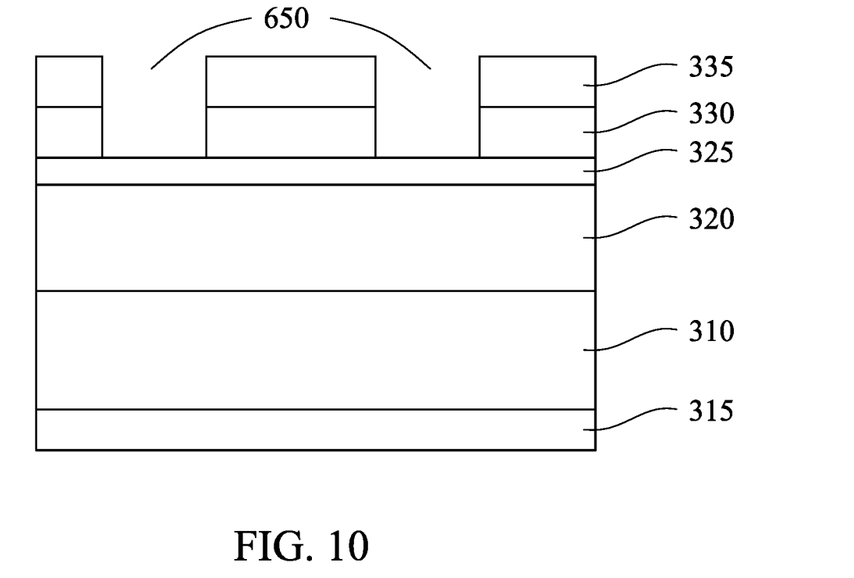
FIG. 10 schematically illustrates a cross-section of one of the various stages during a process of fabricating an EUV mask in accordance with an embodiment of the present disclosure.

The image pattern 650 is then further extended, as shown in FIG. 9, into the antireflection layer 335 and the absorber layer 330 so as to form the image pattern 650 on the mask blank 300. The extension of the image pattern 650 into the antireflection layer 335 and the absorber layer 330 is performed by removing portions of the antireflection layer 335 and the absorber layer 330 that are exposed through the image pattern 650 formed in the hardmask 350. The removal of the exposed portions of the antireflection layer 335 and the absorber layer 330 is performed by dry and/or wet etching using a suitable etchant. Once the image pattern 650 is formed in the antireflection layer 335 and the absorber layer 330, the hardmask 350 is removed, as can be seen in FIG. 10.

Figure 11:
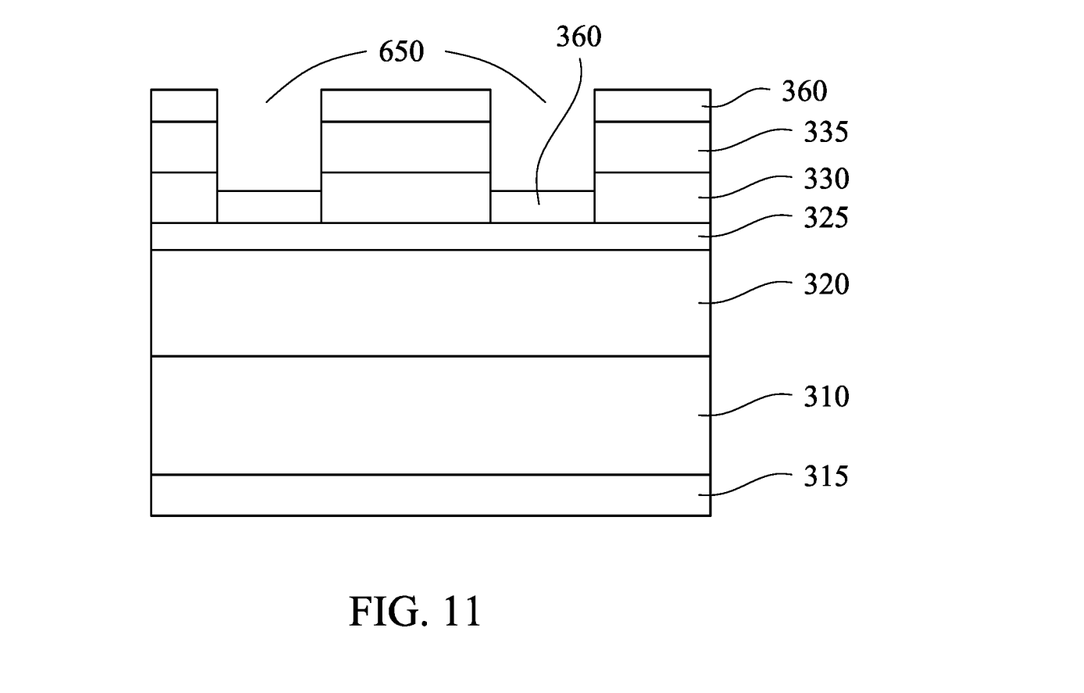
FIG. 11 schematically illustrates a cross-section of one of the various stages during a process of fabricating an EUV mask in accordance with an embodiment of the present disclosure.

At S430, a second resist layer 360 is formed as shown in FIG. 11. The second resist layer 360, in some embodiments, is formed by disposing the material of the second resist layer (referred to herein as the second resist material for brevity) over the absorber layer 330, having the image pattern 650 formed therein, and spinning the substrate at a suitable rotational speed to form a suitable thickness of the second resist layer 360. The rotational speed, in some embodiments, is determined based on the viscosity of the material of the second resist layer 360 and the desired thickness of the second resist layer 360. In various embodiments, the second resist layer 360 is provided at a thickness in a range from about 50 nm to about 1000 nm. In embodiments having the antireflection layer 335 the second resist layer is disposed over the antireflection layer 335.

In some embodiments, the second resist material includes a polymer and a metal oxide, a metal nitride or a metal oxynitride. In particular, in some embodiments, the second resist material includes a polymer and nanoparticles of a metal nitride or a metal oxynitride. The nanoparticles have an average particle size in a range from about 1 nm to about 50 nm in various embodiments. Examples of suitable polymers include, but are not limited to, polyvinylalcohol (PVA), polyvinylpyrrolidone (PVP), poly(ethylene glycol) (PEG), polyamide (PA), polyacrylamide, poly(acrylic acid), poly (methacrylic acid), etc. Examples of suitable metal oxides include, without limitation, oxides of Al, Ti, V, Cr, Mn, Fe, Co, Ni, Cu, Zn, Rb, Sr, Zr, Nb, Mo, Ru, Pd, Ag, Te, Ta, W, Jr, Pt, La, Ce, etc. Examples of the metal nitride include transition metal nitrides such as TiN, ZrN, WN, TaN, etc., or p-block nitrides such as AN, BN, $Si_3N_4$, etc. Examples of oxynitrides include (stoichiometric or non-stoichiometric) transition metal oxynitrides such as titanium oxynitride, etc., or p-block (stoichiometric or non-stoichiometric) oxynitrides such as aluminum oxynitride. Other nitrides and oxynitrides of the same metals as those suitable for metal oxide are also contemplated. The weight ratio of polymer to metal oxide, metal nitride or metal oxynitride is in a range from about 9:1 to about 50:1 in various embodiments.

In various embodiments, the second resist layer 360 is formed of a material having a dose dependent resist tone. For example, in an embodiment, the material of the second resist layer 360 (referred to herein simply as "second resist material" for convenience), is an e-beam resist having a positive resist tone for a first exposure dose (e.g., a low exposure dose) and a negative resist tone for a second exposure dose (e.g., a high exposure dose). A low exposure dose, as referred to herein, is a dose at which the developed resist has a positive tone, and a high exposure dose, as referred to herein, is a dose at which the developed resist has a negative tone. In some embodiments, a high exposure dose is at least one order of magnitude higher than a low exposure dose.

In some embodiments, the second resist material with a negative tone (i.e., following an exposure to actinic radiation at a second exposure dose) has a reflectance of less than about 3% for EUV wavelengths (i.e., wavelengths in a range from about 5 nm to about 20 nm). In some embodiments, the second resist material with a negative tone has a reflectance of less than about 1% for wavelengths in a range from about 12 nm to about 14 nm. For example, in some embodiments, positive tone resist property is observed when the exposure dose is in a range from about 1 mC/cm$^2$ to about 50 mC/cm$^2$. In some embodiments, a negative tone resist property is observed for an exposure dose greater than about 50 mC/cm$^2$.

In some embodiments, the second resist material with negative tone (i.e., following an exposure at the second exposure dose) has a root-mean squared (rms) surface roughness in a range from about 0.1 nm to about 2 nm. Without wishing to be bound by theory, exposure of the second resist material at the second exposure dose causes agglomeration of the nanoparticles in the second resist material to form islands or bumps on the surface of the second resist layer 360, creating a rough surface. Such surface roughness may further reduce undesired reflection from the border region by scattering the EUV radiation incident on the second resist layer.

In some embodiments, the second resist material is formed using a sol-gel process. In other embodiments, the second resist material is formed by dispersing nanoparticles of a suitable metal oxide, metal nitride or metal oxynitride in a suitable polymer.

Figure 12:
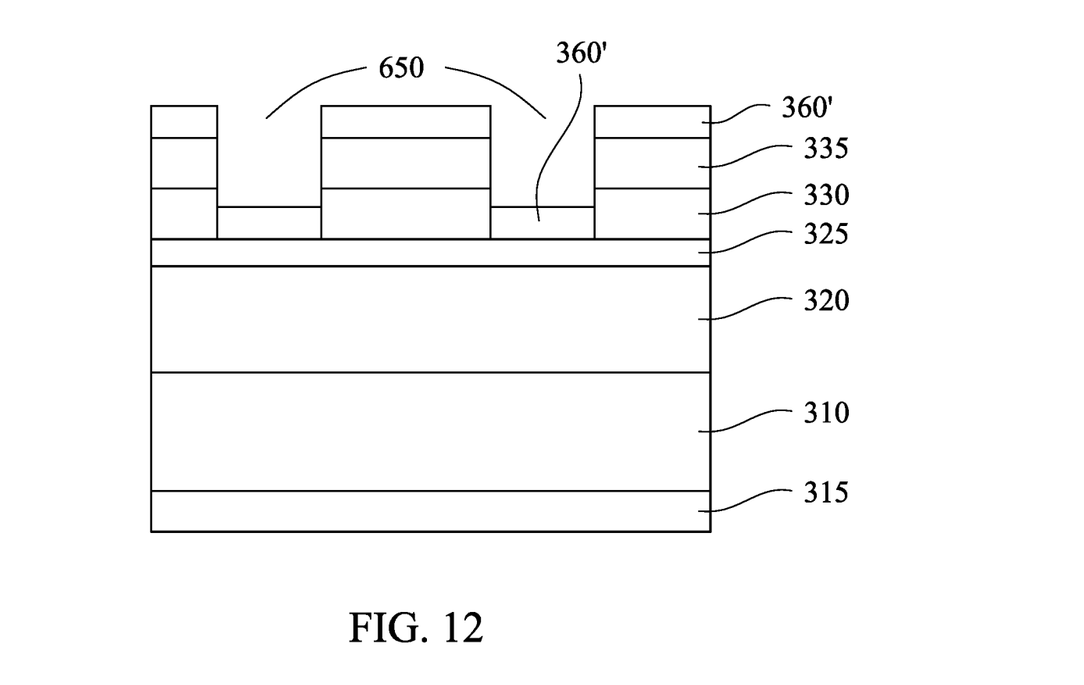
FIG. 12 schematically illustrates a cross-section of one of the various stages during a process of fabricating an EUV mask in accordance with an embodiment of the present disclosure.

At S440, a first exposure is performed on the second resist layer 360 at a first dose at which the second resist material has a positive tone. The first exposure is performed using the same pattern as the image pattern in some embodiments. Following the first exposure, the positive tone second resist layer 360', as shown in FIG. 12, covers the antireflection layer 335 and the capping layer 325 exposed through the image pattern 650 formed in the absorber layer 330.

Figure 13:
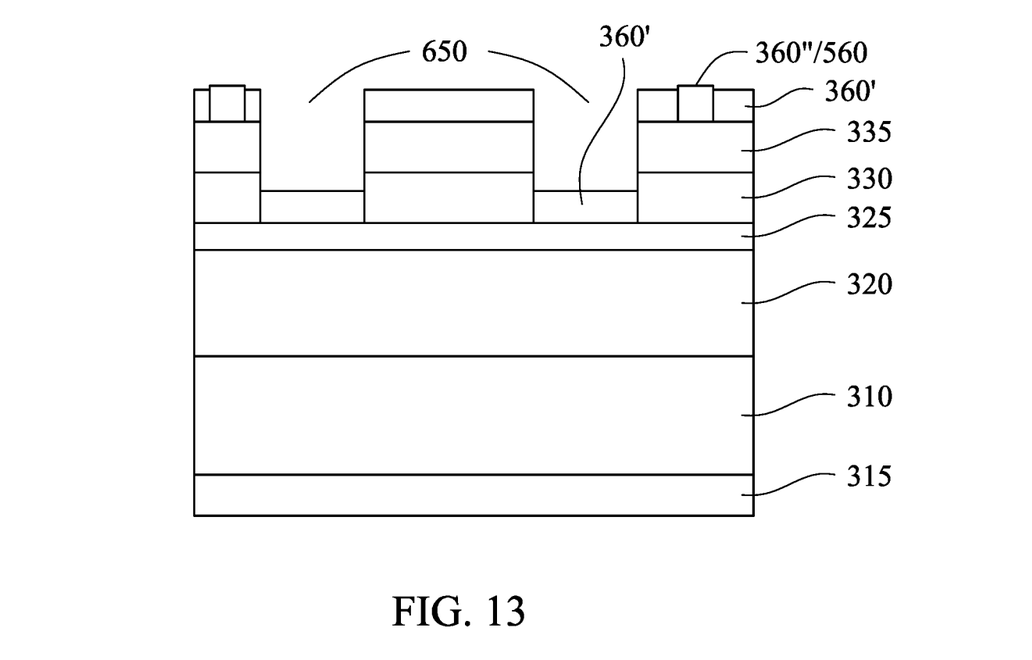
FIG. 13 schematically illustrates a cross-section of one of the various stages during a process of fabricating an EUV mask in accordance with an embodiment of the present disclosure.

At S450, a second exposure is performed on the positive tone second resist layer 360' at a second dose at which the second resist material has a negative tone. As shown in FIG. 13, the second exposure is performed using a pattern corresponding to a border pattern 560 surrounding the image pattern 650. The border pattern 560, in some embodiments, is provided such that a negative tone second resist layer 360" covers the antireflection layer 335 in a portion 560 surrounding the image pattern 650 at location that would reduce undesired exposure of image patterns adjacent the image pattern 650 on the exposure wafer to be exposed using the EUV mask. In other words, the border pattern 560 corresponds to a "black border" region.

Figure 14:
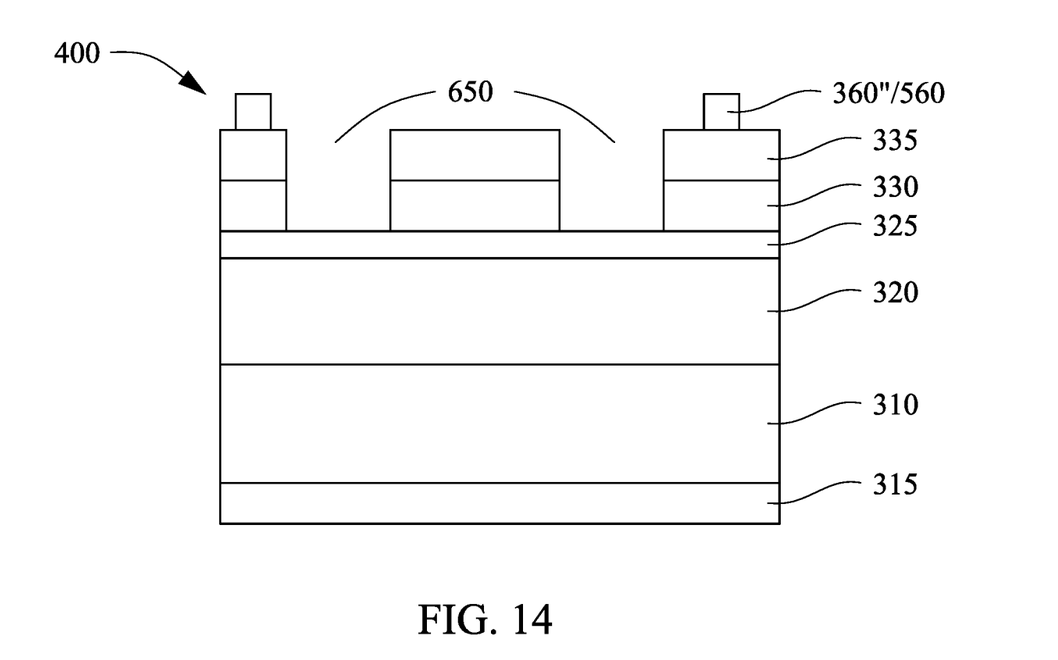
FIG. 14 schematically illustrates a cross-section of one of the various stages during a process of fabricating an EUV mask in accordance with an embodiment of the present disclosure.

At S460, the second resist layer 360', 360" is developed to remove the positive tone resist layer 360'. A bake step is performed before developing the second resist layer, in some embodiments, to pre-cure the resist material and reduce the amount of solvent in the resist material. Following the development operation, the second resist layer 360" is left behind covering portions of the antireflection layer 335 corresponding to the border pattern 560, as can be seen in FIG. 14, because of its negative tone. If necessary, a hard bake step is performed following the development of the second resist layer to further harden the negative tone second resist layer 360" in some embodiments.

In some embodiments, the second resist material is a negative tone resist that is exposed to a suitable dose only in the region corresponding to the border pattern 560. In other embodiments, the second resist material is a positive tone resist that is exposed to a very high exposure dose (e.g., greater than 100 mC/cm$^2$) in the region corresponding to the border pattern 560 resulting in sintering of the positive tone resist and causing it to behave like a negative tone resist in the region corresponding to the border pattern 560. In other words, it is possible to achieve negative tone behavior in a positive tone resist.

Figure 15:
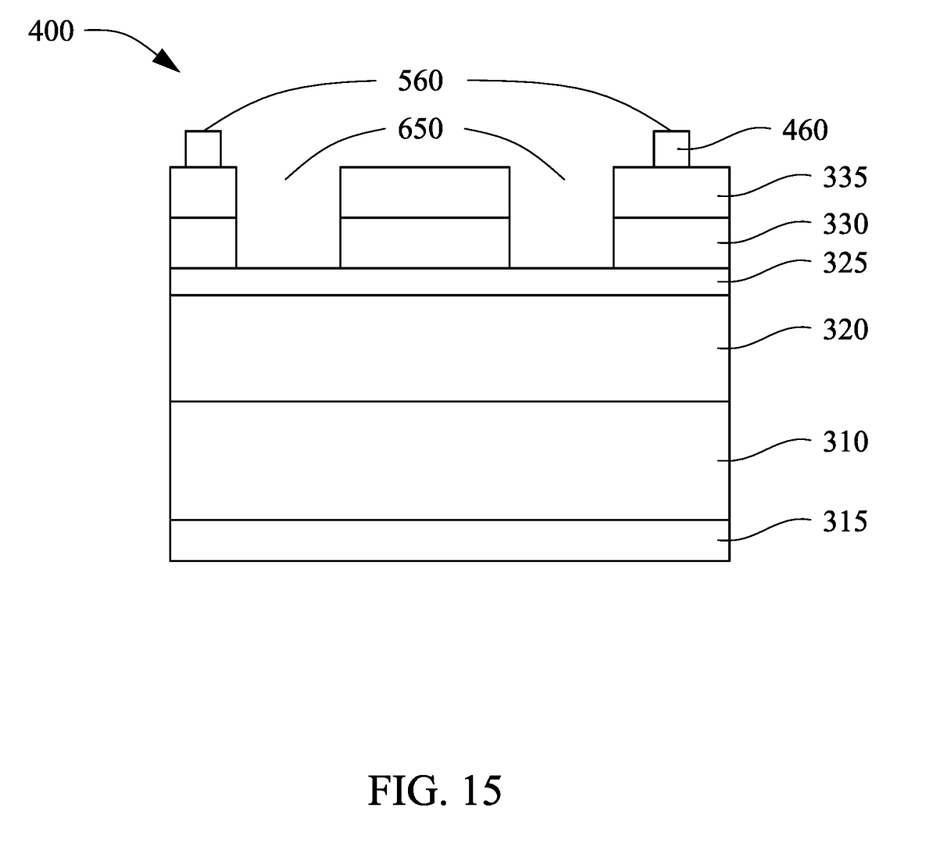
FIG. 15 schematically illustrates a cross-section of an EUV mask in accordance with an embodiment of the present disclosure.

Another aspect of the present disclosure includes an EUV mask having a black border region around an image pattern. FIG. 15 schematically shows a cross-section of an EUV mask in accordance with embodiments of the present disclosure. In an embodiment, the EUV mask 400 includes a substrate 310 and a multilayered EUV reflective (ML) stack 320 disposed over a first major surface of the mask substrate 310. A capping layer 325 is disposed over the ML stack 320, and an EUV absorbing layer or absorber layer 330 disposed over the capping layer 325. Portions of the absorber layer 330 corresponding to an image pattern 650 are removed. A resist layer 460 is disposed on portions of the absorber layer 330 surrounding the image pattern to form a border region 560.

In some embodiments, the EUV mask 400 is formed using the EUV mask blank 300 shown in FIG. 3. The description of the substrate 310, the ML stack 320, the capping layer 325, the absorber layer 330, and the antireflection layer 335 is provided elsewhere herein. The EUV mask blank 300 is processed to form the EUV mask 400 which includes an image region 650 where portions of the absorber layer 330 are removed. The removed portions correspond to areas of a circuit pattern which are to be exposed to the EUV radiation. Thus, EUV radiation incident of mask 400 is reflected from the image region 650 on to the wafer to be exposed using the EUV mask 400, thereby exposing the photoresist coated on the wafer to the EUV radiation and form the circuit pattern in the photoresist.

The mask 400 further includes a border region 560 where a resist layer 460 is disposed on top of the absorber layer 330. The border region 560 is selected to provide a black border for the image pattern so as to reduce undesired exposure of dies adjacent to the die being exposed during a given exposure using the mask 400. In various embodiments, the resist layer 460 has a thickness in a range from about 20 nm to about 1000 nm.

In an embodiment, the material of the resist layer 460 (referred to herein simply as "resist material" for convenience), is an e-beam resist having a positive resist tone for a first exposure dose (e.g., a low exposure dose) and a negative resist tone for a second exposure dose (e.g., a high exposure dose). In some embodiments, the resist material with a negative tone (i.e., following an exposure to actinic radiation at a second exposure dose) has a reflectance of less than about 3% for EUV wavelengths (i.e., wavelengths in a range from about 5 nm to about 20 nm). In many embodiments, the second resist material with negative tone has a reflectance of less than about 1% for wavelengths in a range from about 12 nm to about 14 nm.

In some embodiments, the resist material includes a polymer and a metal oxide, a metal nitride or a metal oxynitride. In particular, in some embodiments, the resist material includes a polymer and nanoparticles of a metal oxide, metal nitride or a metal oxynitride. The nanoparticles have an average particle size in a range from about 1 nm to about 50 nm in various embodiments. Examples of suitable polymers, metal nitrides, metal oxides and metal oxynitrides are discussed elsewhere herein.

In some embodiments, the resist layer 460 is formed of a negative e-beam resist. In other words, only the portion of resist layer 460 exposed to an electron beam is left behind after being developed. In other embodiments, the resist layer 460 is formed of a positive e-beam resist which is hard-cured (e.g., exposed to a very high exposure dose) in the border region 560 and unexposed in the image region 650 such that only the portion of resist layer 460 exposed to an electron beam is left behind after being developed. The term "hard-cured," as referred to herein, means that a positive e-beam resist exposed at dose at which the resist polymerizes to "harden" as if it were a negative resist. Typically, positive e-beam resists are hard-cured at exposure doses that are one or more orders of magnitude higher than a "normal" exposure dose for a positive resist.

Figure 16:
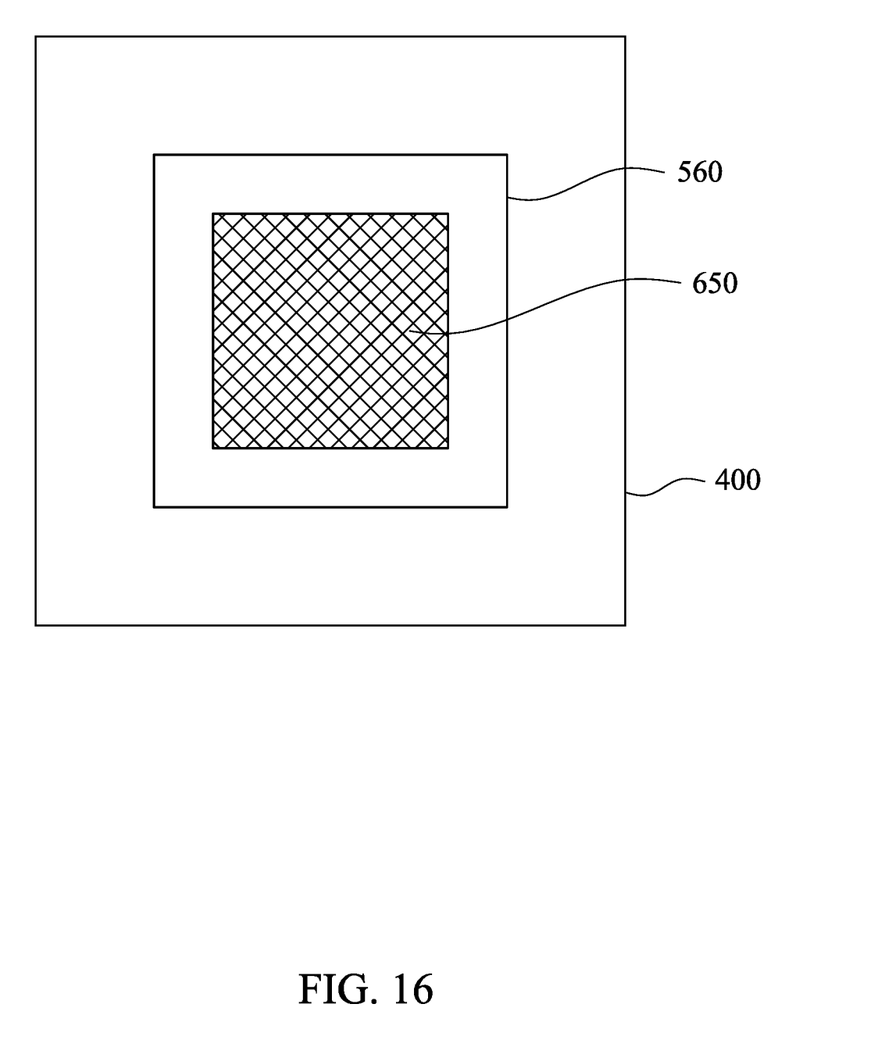
FIG. 16 schematically shows a plan view of an EUV mask in accordance with an embodiment of the present disclosure.

Another aspect of the present disclosure provides an EUV mask having a black border region around an image pattern. FIG. 16 schematically shows a plan view of an EUV mask in accordance with an embodiment of the present disclosure. In an embodiment, the EUV mask 400 includes a pattern region 650 and a border region 560 surrounding the pattern region 650. In some embodiments, the border region 560 is formed of a resist material having a dose dependent resist tone, and a reflectance of less than 3% at wavelengths in a range from 5 nm to 20 nm following an exposure to a dose of actinic radiation at which the resist material has a negative tone. In various embodiments, the border region 560 has a thickness in a range from about 20 nm to about 1000 nm.

In an embodiment, the resist material is an e-beam resist including a polymer and a metal oxide, a metal nitride or a metal oxynitride. In some embodiments, the resist material includes a polymer and nanoparticles of a metal nitride or a metal oxynitride. The nanoparticles have an average particle size in a range from about 1 nm to about 50 nm in various embodiments.

In some embodiments, the resist material has a positive tone at low exposure dose and a negative tone at a high exposure dose.

In some embodiments, the border region 560 is formed of a negative tone resist material having a reflectance of less than 3% at wavelengths in a range from 5 nm to 20 nm after being cured. In yet other embodiments, the border region 560 is formed of a positive tone resist material that is hard-cured by exposing at a very high exposure dose. The positive tone resist in such embodiments, has a reflectance of less than 3% at wavelengths in a range from 20 nm to 1000 nm after being hard-cured.

The various aspects described in the present disclosure provide for an EUV mask with black border region around an EUV mask so as to reduce undesired exposure of adjacent dies on substrate to be exposed to EUV radiation. The black border region, in various embodiments, is formed using a resist material that is exposed at an appropriate dose such that the resist material in the border region is hardened and the resist material in the image region is dissolved away during development. Methods of making EUV masks according to the present disclosure avoid etching steps which can potential degrade other layers of the EUV mask and/or create particulate contaminants. Embodiments of the present disclosure also avoid the ill-controlled physical and/or chemical changes of the reflective ML stack in the border region by laser annealing the ML stack in the border region from a backside of the EUV mask. The black border formed using the embodiments described herein can be formed at a high-throughput without the addition of costly or time consuming process steps.

It will be understood that not all advantages have been necessarily discussed herein, no particular advantage is required for all embodiments or examples, and other embodiments or examples may offer different advantages.

According to one aspect of the present disclosure, a mask for extreme ultraviolet (EUV) lithography including a multilayer (ML) stack comprising alternating metal and semiconductor layers disposed over a first surface of a mask substrate, a capping layer disposed over the ML stack, and an absorber layer having an image pattern formed therein disposed over the capping layer. A border layer surrounding the image pattern is disposed over the absorber layer. In some embodiments, the border layer includes a resist material. In some embodiments, the resist material includes a polymer and a metal oxide, a metal nitride or metal oxynitride. In some embodiments, the border layer has a rms surface roughness in a range from about 0.1 nm to about 2 nm. In some embodiments, the resist material includes metal nitride or metal oxynitride particles having particle size in a range from about 1 nm to about 50 nm. In some embodiments, the border layer has a thickness in a range from about 20 nm to about 1000 nm. In some embodiments, the resist material includes a negative photoresist or a negative electron-beam resist. In some embodiments, the resist material includes a hard-cured positive tone resist.

According to another aspect of the present disclosure, a method of making an EUV lithography mask includes forming a hardmask layer over a mask blank and a first resist layer over the hardmask layer. The mask blank includes a multilayer (ML) stack disposed on a substrate, a capping layer disposed on the ML stack and an absorber layer disposed on the capping layer. An image pattern is formed on the mask blank by patternwise exposing the first resist layer to acitinic radiation and removing a portion of the first resist layer. The image pattern is transferred to the hardmask layer and the absorber layer. A patterned resist layer is formed over the absorber layer and surrounding the image pattern. The patterned resist layer exposes the image pattern. In some embodiments, the forming the patterned resist layer includes disposing a second layer of a material of the patterned resist layer over the absorber layer having the image pattern. The second layer is patternwise exposed to expose an area of the second layer surrounding the image pattern to the actinic radiation at an exposure dose at which the material has a negative tone. The second layer is then developed to form the patterned resist layer on the area surrounding the image pattern. In some embodiments, the material of the patterned resist layer includes a polymer and a metal oxide, a metal nitride or metal oxynitride. In some embodiments, the material of the patterned resist layer includes metal nitride or metal oxynitride particles having particle size in a range from about 1 nm to about 50 nm. In some embodiments, the patterned resist layer has a thickness in a range from about 5 nm to about 500 nm. In some embodiments, the material of the patterned resist layer, following an exposure at an exposure dose at which the material has a negative tone, has a reflectance of less than 3% for wavelengths in a range from about 5 nm to about 20 nm. In some embodiments, the material of the patterned resist layer has a positive tone at a first exposure dose and a negative tone at a second exposure dose higher than the first exposure dose. In some embodiments, transferring the image pattern to the hardmask layer and the absorber layer includes etching the hardmask layer and the absorber layer.

According to yet another aspect of the present disclosure, a mask for EUV lithography includes a pattern region and a border region surrounding the pattern region. The border region has a thickness greater than that of the pattern region and includes a resist material. In some embodiments, the resist material has a thickness in a range from about 20 nm to about 1000 nm. In some embodiments, the resist material includes a polymer and a metal oxide, a metal nitride or metal oxynitride. In some embodiments, the resist material includes metal nitride or metal oxynitride particles having particle size in a range from about 1 nm to 50 about nm. In some embodiments, the resist material includes a negative photoresist or a negative electron-beam resist.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A mask for extreme ultraviolet (EUV) lithography, the mask comprising:
    a substrate;
    a reflective multilayer (ML) stack disposed over a first surface of the substrate;
    a capping layer disposed over the ML stack;
    an absorber layer disposed over the capping layer; and
    a black border pattern disposed over the absorber layer.

2. The mask of claim 1, wherein the black border pattern comprises a resist material.

3. The mask of claim 2, wherein the resist material has a reflectance of less than 3% for wavelengths in a range from about 5 nm to about 20 nm.

4. The mask of claim 2, wherein the black border pattern comprises nanoparticles of a metal oxide, a metal nitride or a metal oxynitride.

5. The mask of claim 4, wherein the nanoparticles have an average particle size in a range from 1 nm to 50 nm.

6. The mask of claim 4, wherein metal of the metal oxide, the metal nitride or the metal oxynitride includes at least one of Al, Ti, Zr, W and Ta.

7. The mask of claim 4, wherein the resist material comprises a polymer of at least one selected from the group consisting of polyvinylalcohol (PVA), polyvinylpyrrolidone (PVP), poly(ethylene glycol) (PEG), polyamide (PA), polyacrylamide, poly(acrylic acid), and poly(methacrylic acid).

8. The mask of claim 7, wherein a weight ratio of the polymer to the metal oxide, the metal nitride or the metal oxynitride is in a range from 9:1 to 50:1.

9. The mask of claim 8, wherein:
    the black border pattern has a thickness in a range from 20 nm to 1000 nm, and
    an antireflection layer including one of $SiO_2$, SiN, TaBO, TaO, CrO or indium tin oxide is disposed between the resist material and the absorber layer.

10. A mask for extreme ultraviolet (EUV) lithography, the mask comprising:
    a substrate;
    a reflective multilayer (ML) stack disposed over a first surface of the substrate;
    a capping layer disposed over the ML stack;
    an absorber layer disposed over the capping layer, the absorber layer comprising a circuit pattern; and
    an organic absorption pattern disposed over the absorber layer, wherein the organic absorption pattern is confined to a region outside the circuit pattern in plan view.

11. The mask of claim 10, wherein:
    the organic absorption pattern surrounds the circuit pattern in the plan view, and
    an antireflection layer including one of $SiO_2$, SiN, TaBO, TaO, CrO or indium tin oxide is disposed between the organic absorption pattern and the absorber layer.

12. The mask of claim 10, wherein the organic absorption pattern has a reflectance of less than 1% for wavelengths in a range from about 5 nm to about 20 nm.

13. The mask of claim 10, wherein the organic absorption pattern comprises a polymer and nanoparticles.

14. The mask of claim 13, wherein the polymer includes at least one selected from the group consisting of polyvinylalcohol (PVA), polyvinylpyrrolidone (PVP), poly(ethylene glycol) (PEG), polyamide (PA), polyacrylamide, poly(acrylic acid), and poly(methacrylic acid).

15. The mask of claim 13, wherein the nanoparticles include at least one selected from the group consisting of oxides of Al, Ti, V, Cr, Mn, Fe, Co, Ni, Cu, Zn, Rb, Sr, Zr, Nb, Mo, Ru, Pd, Ag, Te, Ta, W, Ir, Pt, La or Ce, TiN, ZrN, WN, TaN, AlN, BN, $Si_3N_4$, titanium oxynitride, and aluminum oxynitride.

16. A mask for extreme ultraviolet (EUV) lithography, the mask comprising:
    a substrate;
    a reflective multilayer (ML) stack disposed over a first surface of the substrate;
    a capping layer disposed over the ML stack;
    an absorber layer disposed over the capping layer; and
    a border layer comprising agglomerated nanoparticles disposed over a portion of the absorber layer.

17. The mask of claim 16, wherein the border layer has a root-mean squared (rms) surface roughness in a range from 0.1 nm to 2 nm.

18. The mask of claim 17, wherein the nanoparticles comprise a metal oxide.

19. The mask of claim 17, the nanoparticles comprise a metal nitride.

20. The mask of claim 17, the nanoparticles comprise a metal oxynitride.

* * * * *